(12) United States Patent
Rose et al.

(10) Patent No.: US 11,342,176 B2
(45) Date of Patent: May 24, 2022

(54) INTEGRATED ELECTROHYDRODYNAMIC JET PRINTING AND SPATIAL ATOMIC LAYER DEPOSITION SYSTEM FOR AREA SELECTIVE-ATOMIC LAYER DEPOSITION

(71) Applicant: The Regents of the University of Michigan, Ann Arbor, MI (US)

(72) Inventors: Mattison Rose, Ann Arbor, MI (US); Kira Barton, Ann Arbor, MI (US); Neil Dasgupta, Ann Arbor, MI (US); Lauren Ransohoff, Brookline, MA (US); Ellis Herman, Cambridge, MA (US); Orlando Trejo, Ann Arbor, MI (US); Carli Huber, Norwalk, CT (US); Tae H. Cho, Ann Arbor, MI (US); Eric Kazyak, Ann Arbor, MI (US); Christopher P. Pannier, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 19 days.

(21) Appl. No.: 16/937,496

(22) Filed: Jul. 23, 2020

(65) Prior Publication Data
US 2021/0028006 A1    Jan. 28, 2021

Related U.S. Application Data

(60) Provisional application No. 62/877,584, filed on Jul. 23, 2019.

(51) Int. Cl.
*H01L 21/02* (2006.01)
*C23C 16/455* (2006.01)
(Continued)

(52) U.S. Cl.
CPC ............ *H01L 21/0228* (2013.01); *B41J 2/06* (2013.01); *C23C 16/45544* (2013.01);
(Continued)

(58) Field of Classification Search
None
See application file for complete search history.

(56) References Cited

U.S. PATENT DOCUMENTS 7,247,346 B1 * 7/2007 Sager .................. G01R 31/307
427/162
8,318,249 B2 * 11/2012 Levy ...................... C23C 16/04
427/248.1

(Continued)

FOREIGN PATENT DOCUMENTS

WO    2015073064 A1    5/2015

OTHER PUBLICATIONS

Z. Wang et al., "An Application of Spatial Iterative Learning Control to Micro-Additive Manufacturing", American Control Conference (ACC), pp. 354-359, 2016.
(Continued)

*Primary Examiner* — Karla A Moore
(74) *Attorney, Agent, or Firm* — Reising Ethington P.C.

(57) ABSTRACT

An integrated electrohydrodynamic jet printing and spatial atomic layer deposition system for conducting nanofabrication includes an electrohydrodynamic jet printing station that includes an E-jet printing nozzle, a spatial atomic layer deposition station that includes a zoned ALD precursor gas distributor that discharges linear zone-separated first and second ALD precursor gases, a heatable substrate plate supported on a motion actuator controllable to move the substrate plate in three dimensions, and a conveyor on which the motion actuator is supported. The conveyor is operative to move the motion actuator between the electrohydrody-
(Continued)

namic jet printing station and the spatial atomic layer deposition station so that the substrate plate is conveyable between a printing window of the E-jet printing nozzle and a deposition window of the zoned ALD precursor gas distributor, respectively. A method of conducting area-selective atomic layer deposition is also disclosed.

19 Claims, 8 Drawing Sheets

(51) Int. Cl.
  *B41J 2/06* (2006.01)
  *C23C 16/52* (2006.01)
  *C23C 16/54* (2006.01)
(52) U.S. Cl.
  CPC .. *C23C 16/45551* (2013.01); *C23C 16/45553* (2013.01); *C23C 16/52* (2013.01); *C23C 16/54* (2013.01); *H01L 21/02288* (2013.01)

(56) References Cited

U.S. PATENT DOCUMENTS

| | | | |
|---|---|---|---|
| 9,415,590 B2* | 8/2016 | Barton | B41J 2/06 |
| 2003/0183165 A1* | 10/2003 | Kakimoto | H01L 21/67236 |
| | | | 118/35 |
| 2005/0167404 A1* | 8/2005 | Yamazaki | H01L 21/6715 |
| | | | 219/121.43 |
| 2007/0089857 A1* | 4/2007 | Chiang | B01J 19/0046 |
| | | | 165/80.2 |
| 2009/0065026 A1* | 3/2009 | Kiehlbauch | H01J 37/3233 |
| | | | 134/1.2 |
| 2011/0290175 A1* | 12/2011 | Paranjpe | C23C 16/4582 |
| | | | 117/85 |
| 2012/0196444 A1 | 8/2012 | Lennon | |
| 2014/0065803 A1 | 3/2014 | Ellinger | |

OTHER PUBLICATIONS

J. H. Pikul et al., "High Precision Electro-Hydrodynamic Printing of Polymer onto Microcantilever Sensors", IEEE Sensors Journal, vol. 11, No. 10, pp. 2246-2253, Oct. 2011.
H. Qin et al., "Ac-pulse Modulated Electro-Hydrodynamic (ehd) Direct Printing of Conductive Micro Silver Tracks for Micro-Manufacturing", pp. 763-770, 2014.
C. Wei et al., "Development and Modeling of Melt Electrohydrodynamic-Jet Printing of Phase-Change Inks for High-Resolution Additive Manufacturing", vol. 136, p. 061010, 2014.
S. H. Hashimdeen et al., "The Design and Construction of an Electrohydrodynamic Cartesian Robot for the Preparation of Tissue Engineering Constructs," PLOS ONE, vol. 9, No. 11, pp. 1-11, 2014.
International Search Report corresponding to International Application No. PCT /US2020/043346, dated Nov. 13, 2020, 3 pages.
Written Opinion corresponding to International Application No. PCT /US2020/043346, dated Nov. 13, 2020, 6 pages.

* cited by examiner

INTEGRATED ELECTROHYDRODYNAMIC JET PRINTING AND SPATIAL ATOMIC LAYER DEPOSITION SYSTEM FOR AREA SELECTIVE-ATOMIC LAYER DEPOSITION

STATEMENT REGARDING FEDERALLY SPONSORED RESEARCH OR DEVELOPMENT

This invention was made with government support under CMMI1727918 awarded by the National Science Foundation. The government has certain rights in the invention.

FIELD

The present disclosure relates generally to area-selective atomic layer deposition for the nanofabrication of 3-D thin-films for printable and customizable devices.

BACKGROUND

Area-selective atomic layer deposition (AS-ALD) is a method for selectively depositing ALD thin-films for devices including, for example, thin film transistors in an additive, bottom-up manner without the need for lithography and top-down etching processes. In AS-ALD, an inhibition material is first patterned onto a working surface of a build substrate to passivate surface reaction sites and inhibit growth on the underlying surface of the build substrate. A thin-film material, such as a metal oxide film, is then deposited on the growth areas of the working surface not covered by the inhibition material, typically by atomic layer deposition (ALD). By taking advantage of the inherent self-limiting and surface reaction mechanism of ALD, the patterned inhibition material can prevent precursor ligands from adhering to the substrate surface.

Atomic layer deposition (ALD) is a thin-film deposition technique that is capable of conformally coating a surface of a build substrate—which may be an ultra-high-aspect ratio substrate—with a nanometer-scale film of an ALD material one atomic layer at a time. ALD involves sequentially exposing a designated portion of the build substrate to various ALD precursor gases. Each of the ALD precursor gases includes reactive ligands that participate in a self-limiting surface reaction to chemically deposit an atomic monolayer of the reacted precursor gases. The two atomic monolayers that are derived alternately from the ALD precursor gases together produce a single atomic layer of the ALD material film upon completion of their reaction. As such, the growth rate and thickness of the ALD material film can be controlled by varying the number of ALD cycles performed and, thus, the number of atomic layers of the ALD material that are chemically-deposited in a layer-by-layer fashion. Indeed, the ALD material film exhibits a linear growth rate; that is, the thickness of the film is proportional to the number of ALD cycles performed. The material that can be deposited by ALD can range from oxides to nitrides, sulfides, carbides, and/or metals by exploiting the self-limiting binary chemical reactions of ALD.

Spatial atomic layer deposition (SALD) is a specific version of ALD where the ALD cycles are spatially controlled by exposing the build substrate to different precursor gas zones rather than a conventional temporally controlled ALD process where long purging of the precursor gases in a static chamber is required. In SALD, the time-consuming purge step of conventional ALD is not practiced, which expediates the process by up to three orders of magnitude, without sacrificing the self-limiting, conformal growth of the ALD material film. As a result, the net deposition rate of SALD is much greater compared to conventional ALD, which enables higher throughput in a shorter amount of time. SALD deposition processes may be performed in conjunction with the prior patterning of the inhibition material during AS-SALD to fabricate 3-D devices in a bottom-up manner without the need for lithography and top-down etching processes. The thin-film 3-D devices may even include multiple films of dissimilar materials to stack thin film layers for device fabrication.

AS-ALD with 3D printing technology has been practiced using drop-on-demand inkjet printing to deposit inhibition material patterns to inhibit growth of ALD films such as zinc oxide (ZnO) and aluminum-doped-zinc oxide (AZO). However, inkjet printing uses thermal or acoustic pulses in formation and ejection of the droplets which makes it difficult to control the droplet diameter and ink volume for higher resolution. Traditional inkjet printing has a limited spatial resolution of approximately 20 μm, and, therefore, is generally not suitable for nanofabricating thin-film devices that may require nanoscale resolution. Furthermore, by having to transfer the build substrate between dedicated substrate plates for each of the ink jet printing and ALD stations, throughput is decreased due to the down time associated with the transfer process, and the probability for realignment errors causes the repeatability and consistency of the process to suffer. For example, if an inhibition material pattern is printed on a build substrate, and the build substrate has to be removed, transferred, and re-supported at the ALD station, the ability to precisely align the printed inhibition layer pattern with the pattern to be deposited at the ALD station is a difficult endeavor.

The present disclosure describes an integrated electrohydrodynamic jet printing (E-jet printing) and spatial atomic layer deposition (SALD) system for conducting nanofabrication of customizable 3-D thin-film devices. E-jet printing uses an electric field—instead of the thermal bubble or piezo acoustic actuation used in drop-on-demand ink jet printing—to expel jetted liquid drops containing an inhibition polymer from a nozzle orifice that can be submicron sized. The smaller nozzle coupled with electric field actuation can achieve more than three orders of magnitude drop volume reduction compared to ink jet printing and sub 100-nm jetted drops and printed lines. When used to print inhibition material patterns as part of AS-ALD, E-jet printing enables patterns up to spatial resolutions of 100 nm or less to be printed in the X- and Y-plane, which is a notably higher resolution than is practically possible with ink jet printing. Combined with AS-SALD, the high-resolution printing made possible by E-jet printing widens the applicability of AS-ALD to enable the nanofabrication of customizable 3-D thin-film devices.

Moreover, by integrating E-jet printing and SALD into one single platform in which the same substrate plate is conveyed between the two stations along a conveyor, the build substrate can be shuttled or conveyed back-and-forth between the two stations without having to be removed from the substrate plate. The overall process can thus be performed with less downtime and more precise alignment of the build substrate at each station. The use of E-jet printing to print the inhibition material pattern, as opposed to ink jet printing, and the automated conveyance of the build substrate between the E-jet and SALD stations on the same substrate plate can produce thin-film devices, such as printed electronic circuits, on the sub-100 nm resolution scale with enhanced precision. The disclosed E-jet/SALD integrated system is also less cumbersome and more customizable than other conventional thin-film manufacturing techniques such as photolithography combined with top-down etching. Furthermore, inhibitor materials that are easily soluble in organic solvents may be removed by exposing the build substrate to solvent vapors in the SALD station or at some other location. In this way, ALD films can be printed and stacked in-situ in a 3-D additive manner.

SUMMARY

According to one aspect of the disclosure, there is provided an integrated electrohydrodynamic jet printing and spatial atomic layer deposition system for conducting nanofabrication. The system includes:
an electrohydrodynamic jet printing station that includes an E-jet printing nozzle;
a spatial atomic layer deposition station that includes a zoned ALD precursor gas distributor that discharges linear zone-separated first and second ALD precursor gases;
a heatable substrate plate supported on a motion actuator controllable to move the substrate plate in three dimensions; and
a conveyor on which the motion actuator is supported, the conveyor being operative to move the motion actuator between the electrohydrodynamic jet printing station and the spatial atomic layer deposition station so that the substrate plate is conveyable between a printing window of the E-jet printing nozzle and a deposition window of the zoned ALD precursor gas distributor, respectively.

According to various embodiments, the integrated electrohydrodynamic jet printing and spatial atomic layer deposition system may further include any one of the following features or any technically-feasible combination of some or all of these features:
  a cooling station located between the electrohydrodynamic jet printing station and the spatial atomic layer deposition station;
  the motion actuator comprises at least one linear motion stage that supports the substrate plate;
  the motion actuator further comprises a central block that is secured to the at least one linear motion stage and a base plate that is disposed on the central block, and wherein the motion actuator additionally comprises a plurality of linear actuators secured to the central block and which extend through corresponding openings in the base plate and engage and support the substrate plate above the base plate;
  the plurality of linear actuators is controllable to adjust the tilt of the substrate plate relative to the base plate;
  the conveyor defines a linear travel path for the motion actuator that extends between the electrohydrodynamic jet printing station and the spatial atomic layer deposition station;
  the conveyor is a linear actuator;
  the conveyor includes opposed linear guides, a central guide track that contains a rotatable threaded screw, and an adapter plate onto which the motion actuator is mounted;
  the zoned ALD precursor gas distributor comprises a depositor head that has an active surface configured to discharge at least one linear flow of the first ALD precursor gas, at least one linear flow of the second ALD precursor gas, and at least one linear flow of the inert gas that separates the linear flow of the first ALD precursor gas and the linear flow of the second ALD precursor gas.

According to another aspect of the disclosure, there is provided an integrated electrohydrodynamic jet printing and spatial atomic layer deposition system for conducting nanofabrication. The system includes:
an electrohydrodynamic jet printing station that includes an E-jet printing nozzle;
a spatial atomic layer deposition station that includes a zoned ALD precursor gas distributor that discharges linear zone-separated first and second ALD precursor gases;
a heatable substrate plate supported on a motion actuator that comprises at least one linear motion stage that supports the substrate plate and commands movement of the substrate plate within a horizontal plane along two coordinate axes;
a build substrate retained on the heatable substrate plate, the build substrate having a working surface on which an inhibition material is applied at the electrohydrodynamic jet printing station and an ALD material film is grown at the spatial atomic layer deposition station; and
a conveyor on which the motion actuator is supported, the conveyor being operative to move the motion actuator along a linear travel path between the electrohydrodynamic jet printing station and the spatial atomic layer deposition station.

According to various embodiments, the integrated electrohydrodynamic jet printing and spatial atomic layer deposition system may further include any one of the following features or any technically-feasible combination of some or all of these features:
  a cooling station located between the electrohydrodynamic jet printing station and the spatial atomic layer deposition station;
  an atomic force microscope According to another aspect of the disclosure, there is provided a method of conducting area-selective atomic layer deposition. The method includes the steps of:
positioning a heatable substrate plate that supports a build substrate within a printing window of an E-jet printing nozzle of an electrohydrodynamic jet printing station;
forming a pattern of an inhibition material onto a working surface of the build substrate to define an ALD growth area on the working surface using the E-jet printing nozzle;
conveying the heatable substrate plate away from the printing window of the E-jet printing nozzle of the electrohydrodynamic jet printing station and to a spatial atomic layer deposition station without removing the build substrate from the substrate plate;
positioning the heatable substrate plate that supports the build substrate within a deposition window of a zoned ALD precursor gas distributor discharges linear zone-separated first and second ALD precursor gases towards the substrate plate; and depositing an ALD material film onto the ALD growth area.

According to various embodiments, the integrated electrohydrodynamic jet printing and spatial atomic layer deposition system may further include any one of the following features or any technically-feasible combination of some or all of these features:
  conveying the heatable substrate plate along the conveyor away from the deposition window of the zoned ALD precursor gas distributor and to a cooling station located between the electrohydrodynamic jet printing station and the spatial atomic layer deposition station, and cooling the heatable substrate plate;
  providing a deposited layer of an inhibition material over the working surface of the build substrate, and printing a solvent onto the layer of the inhibition material to selectively remove a portion of the layer of the inhibition material to form the pattern of the inhibition material;

printing an inhibition material solution onto the working surface of the build substrate to apply the pattern of the inhibition material onto the working surface;

removing some or all of the pattern of the inhibition material after the ALD material film has been deposited onto the ALD growth area;

curing some or all of the pattern of the inhibition material after the ALD material film has been deposited onto the ALD growth area;

thermally annealing some or all of the pattern of the inhibition material after the ALD material film has been deposited onto the ALD growth area.

DRAWINGS

Example embodiments will hereinafter be described in conjunction with the appended drawings, wherein like designations denote like elements, and wherein.

Figure 13:
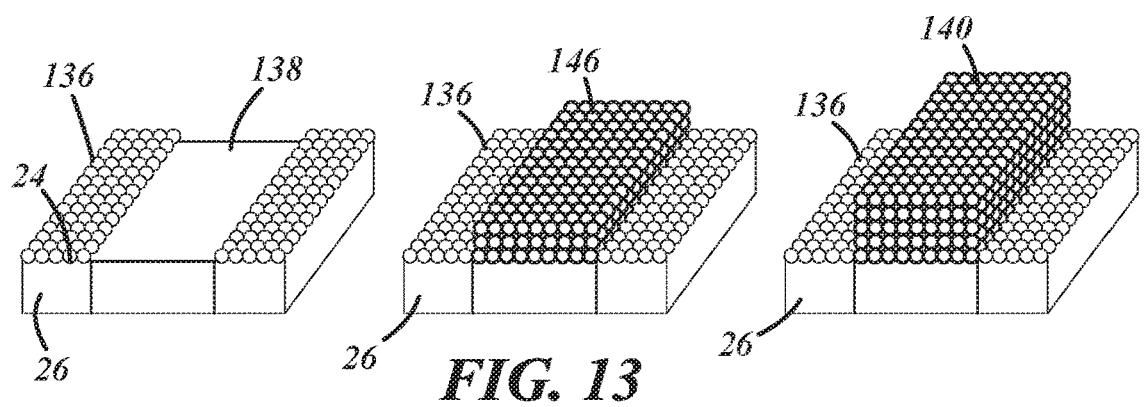
Figure 14:
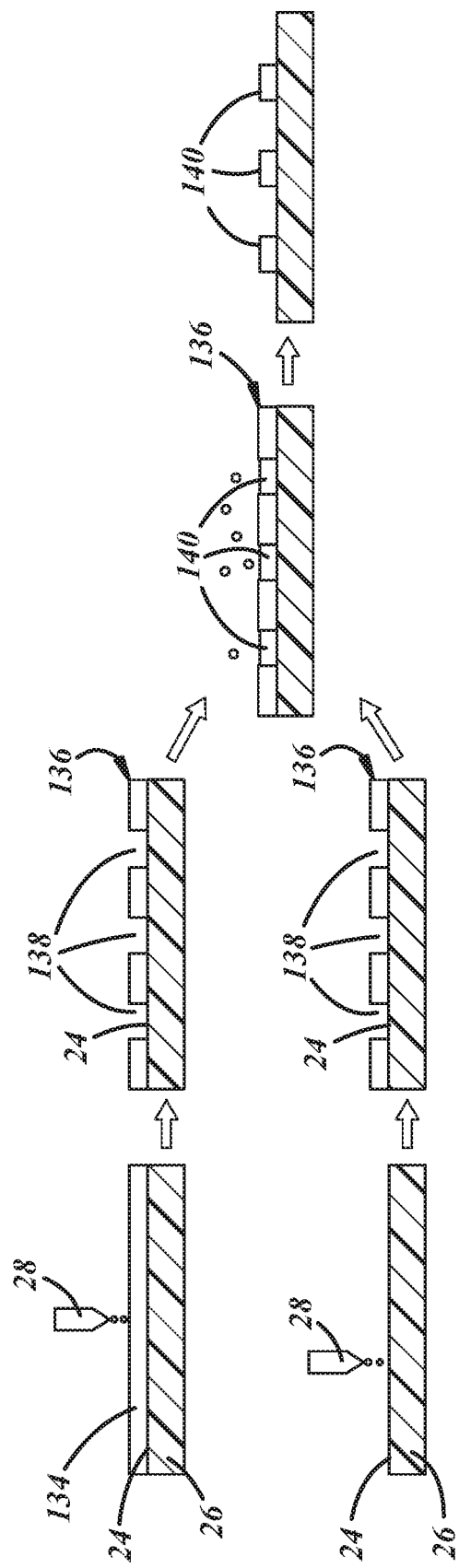

FIG. 13 is a schematic illustration of an ALD material film being grown on a working surface of a build substrate by area-selective atomic layer deposition (AS-ALD) according to one embodiment of the present disclosure; and FIG. 14 is a schematic illustration of an AS-ALD process that employs a negative printing approach (top) and a positive printing approach (bottom) at the E-jet printing station.

DESCRIPTION

An integrated electrohydrodynamic jet printing (E-jet printing) and spatial atomic layer deposition (SALD) system 10 is disclosed. Several views of the integrated E-jet printing and SALD system 10 are shown in FIGS. 1-5. As depicted, the E-jet printing and SALD system 10 includes an E-jet printing station 12, a SALD station 14, a cooling station 16, a heatable substrate plate 18 with a vacuum chuck used to hold a build substrate in place, a motion actuator 20, and a conveyor 22. The integrated E-jet printing and SALD system 10 can perform area-selective atomic layer (AS-ALD) deposition onto a working surface 24 of a build substrate 26 (FIGS. 4 and 6), such as a silicon wafer or a substrate composed of some other an inorganic or organic material, for the nanofabrication of customizable 3-D thin-film devices including 3-D printed thin-film electronics. With careful pattern design and printing of an inhibition material at the E-jet printing station 12, and automated conveyance of the common substrate plate 18 between the E-jet printing and the SALD stations 12, 14, thin-film devices including electronic circuit components having a sub-100 nm spatial resolution and Z-axis spatial resolution on the atomic scale (Å-resolution by ALD) can be fabricated. The integration of the E-jet printing station 12 and the SALD station 14 enhances production throughput and minimizes the probability that the build substrate 26 carried by the substrate plate 18 will be misaligned at either of the stations 12, 14.

Figure 1:
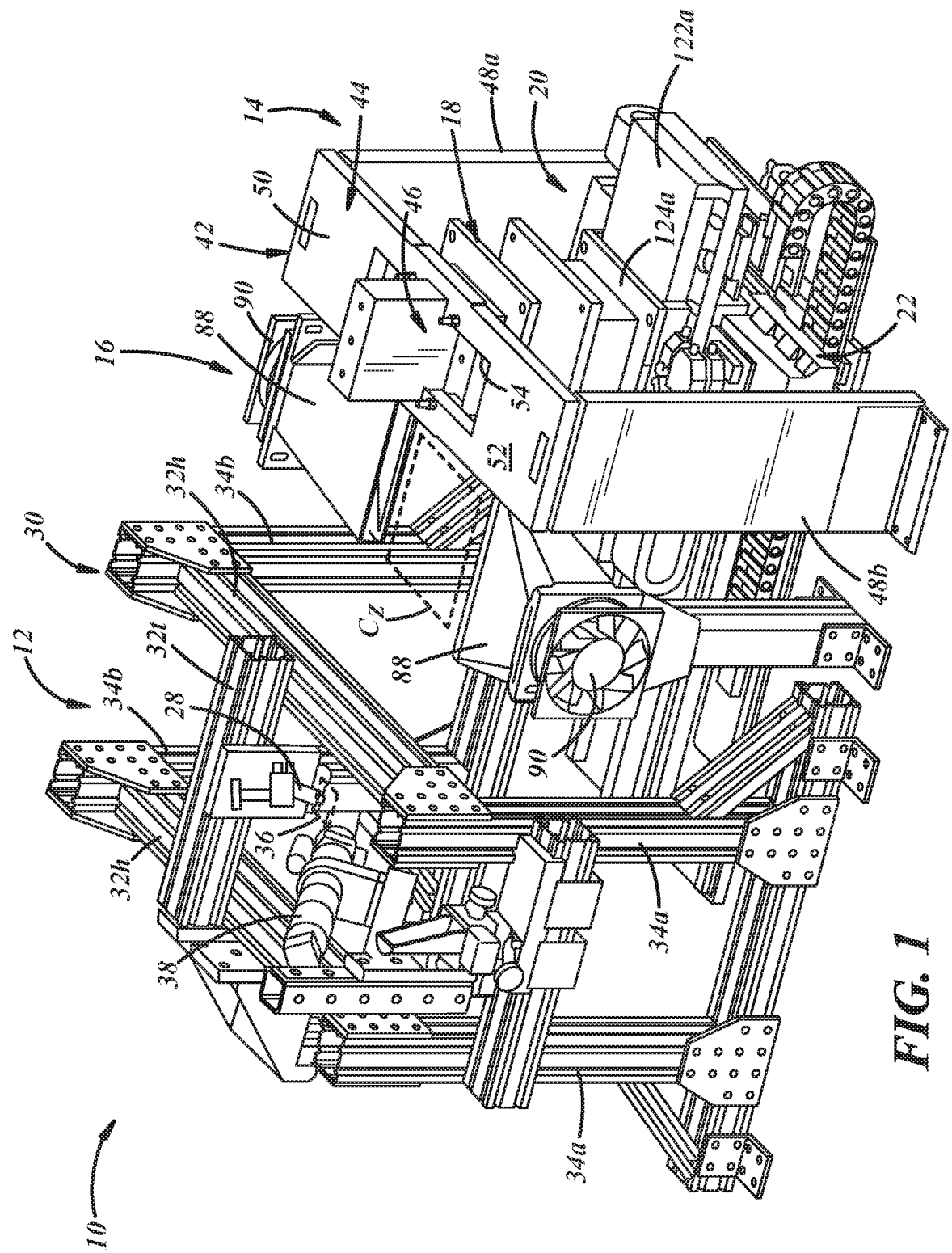
FIG. 1 is a perspective view of an integrated electrohydrodynamic jet printing (E-jet printing) and spatial atomic layer deposition (SALD) system according to one embodiment of the present disclosure.
Figure 2:
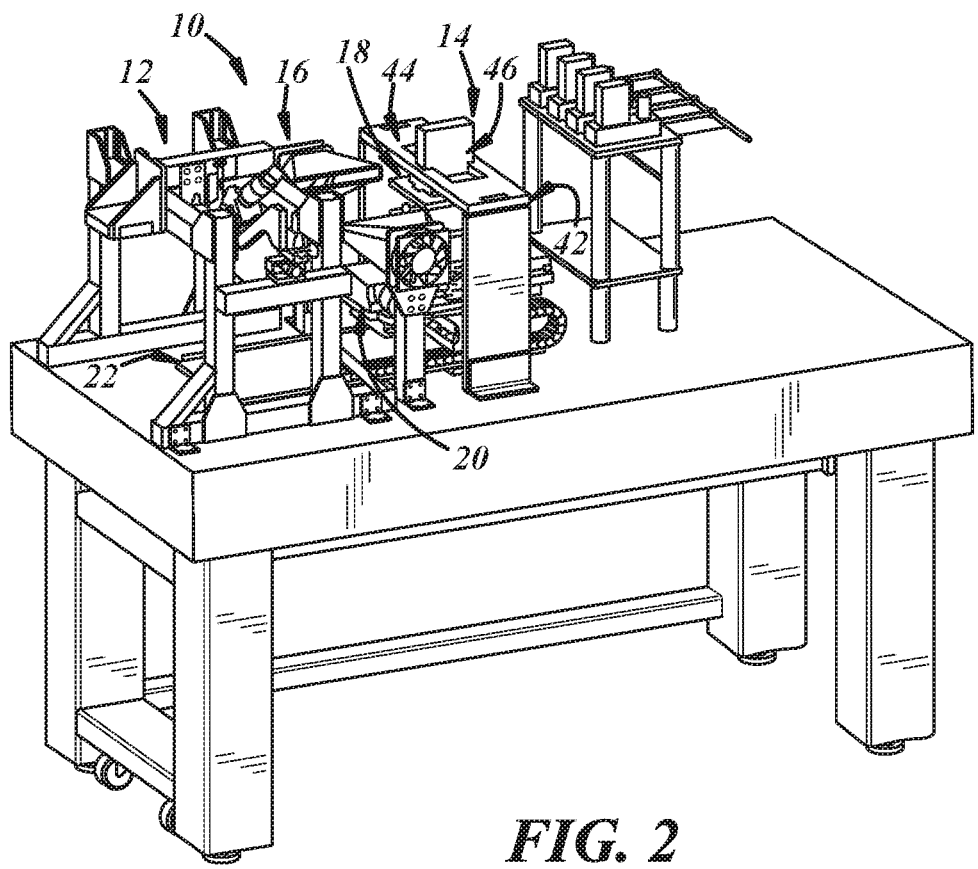
FIG. 2 is another perspective view of the integrated E-jet printing and SALD system illustrated in FIG. 1 from a different perspective according to one embodiment of the present disclosure.
Figure 3:
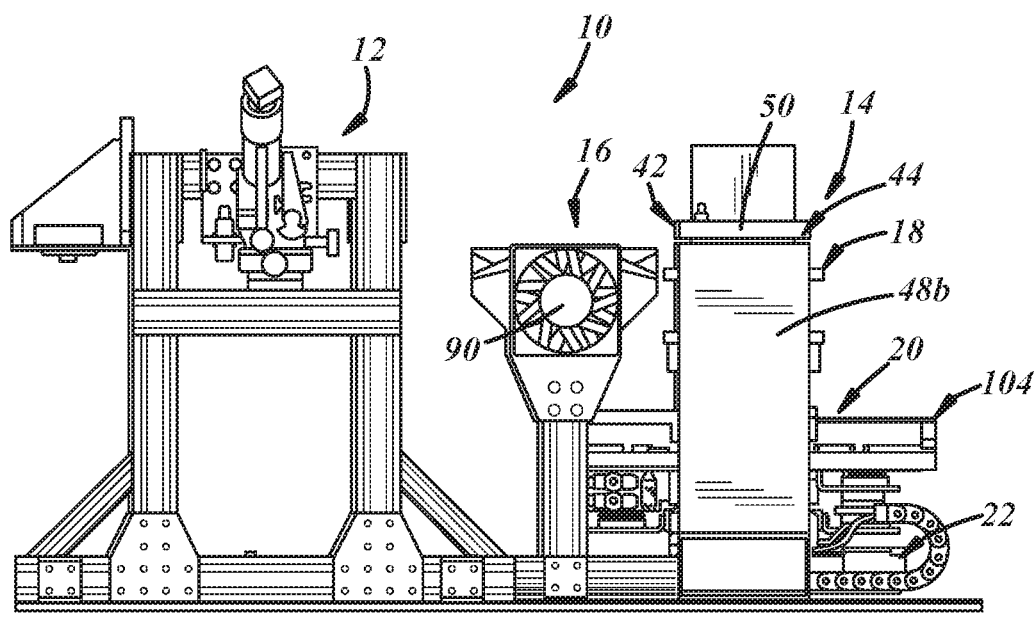
FIG. 3 is a side elevational view of the integrated E-jet printing and SALD system illustrated in FIG. 1 according to one embodiment of the present disclosure.
Figure 6:
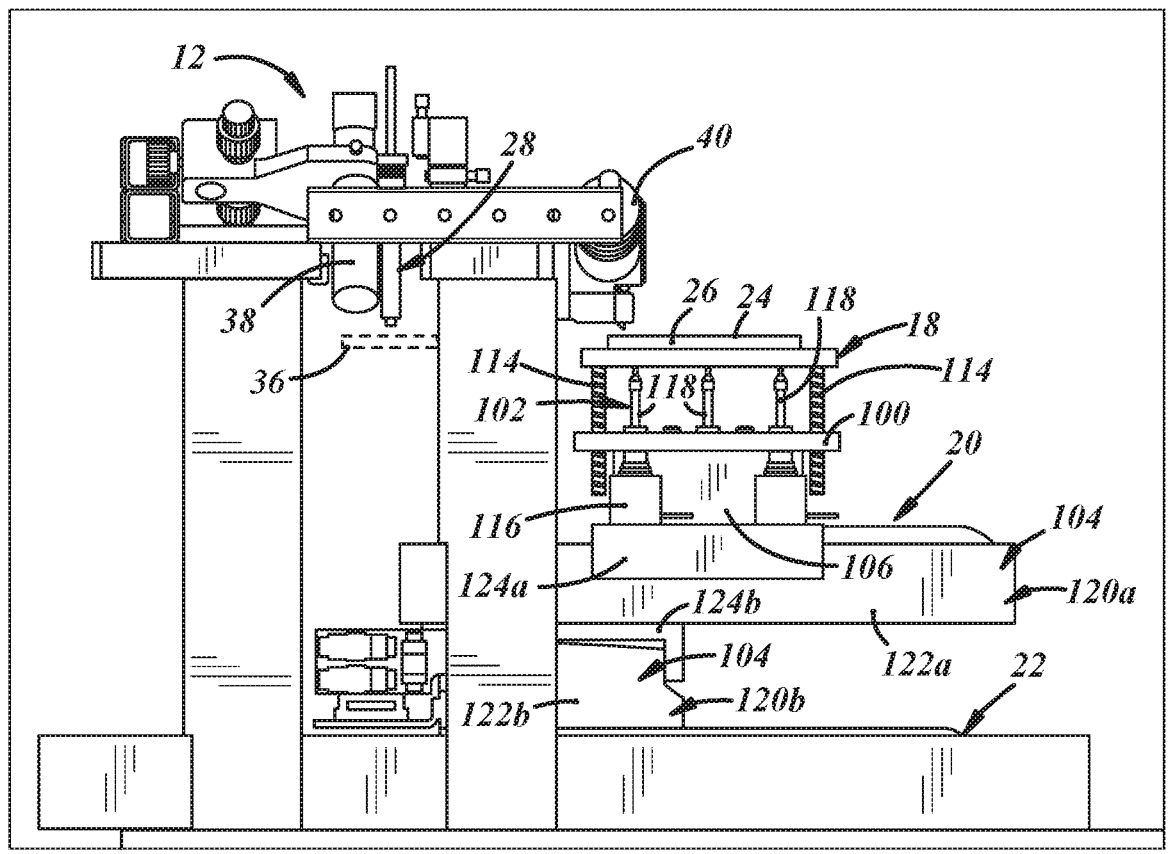
FIG. 6 is a side view of the E-jet printing station of the integrated E-jet printing and SALD system illustrated in FIG. 1 according to one embodiment of the present disclosure.

The E-jet printing station 12 includes an E-jet printing nozzle 28 mounted to an E-jet bridge 30 that contains a pair of horizontal rails 32$h$, each of which extends between opposed upstanding legs 34$a$, 34$b$ that are supported on a stand surface, and a transverse rail 32$t$ that extends between the horizontal rails 32$h$. The E-jet printing nozzle 28, which is shown best in FIGS. 1 and 6, is secured to a mounting plate that, in turn, is secured to the transverse rail 32$t$. The E-jet printing nozzle 28 expels jetted liquid droplets from a polarizable liquid through an electric field onto the working surface 24 of the build substrate 26 at high resolution within a printing window 36. The electric field, more specifically, induces flow in the polarizable liquid and, when strong enough, the surface charge repulsion experienced by the polarizable liquid at a pipette tip of the nozzle 28 ejects the jetted liquid droplets from the nozzle 28 towards the working surface 24 of the build substrate 26 in a controlled and designated pattern.

The jetted liquid droplets ejected from the E-jet printing nozzle 28 may contain a solvent only or a solution that includes an inhibition material for patterned printing. An inhibition material that may be expelled from the E-jet printing nozzle 28 within the jetted liquid droplets for purposes of AS-ALD may be any polymer that lacks the required reaction sites to which the ligands of the ALD precursor gases may bond; in other words, the polymer is unreactive or chemically inert with regards to the ALD precursor gases. Such polymer materials obstruct the ALD precursor gases from binding to the underlying working surface 24 beneath the inhibition material at a later time yet allow the selective ALD growth on the working surface 24 of the build substrate 26 that is not covered by the inhibition material pattern. Several examples of suitable polymers that may be employed as the inhibition material include poly (methyl methacrylate) (PMMA) and poly(vinylpyrrolidone) (PVP). These polymers are typically dissolved or dispersed in a solvent such as water, dimethyl sulfoxide (DMSO), or anisole. If the liquid droplets contain a solvent only, the solvent may include N-Methyl-Pyrrolidone (NMP).

In addition to the E-jet printing nozzle 28, the E-jet printing station 12 may include a camera 38 and, optionally, as shown in FIG. 6, an AFM (atomic force microscope) 40. The camera 38 allows for viewing and recording of the jetted liquid droplets being expelled towards the build substrate 26, including the process of printing a pattern of the inhibition material onto the working surface 24 if the droplets include such a polymer. The AFM 40 allows for measuring the dimensions of the printed patterns created by the E-jet printing nozzle 28 and to analyze the morphology of the selectively grown ALD film. The AFM 40 includes a cantilevered tip that scans or probes the build substrate and interacts with the inhibition material patter and/or the ALD material film. The motion and deflections of the tip caused by those interactions are detected, often by a laser optical system or piezoelectric sensors, and imagery is produced of the profile of the inhibition material layer and/or the ALD material film at nanometer-scale resolution of less. While the AFM 40 is shown here as part of the E-jet printing station 12, the AFM 40 does not necessarily have to be part of the E-jet printing station 12 as it can be located elsewhere in the system 10. Additionally, and while not shown here, the E-jet printing nozzle 28 may be connected to a signal generator and amplifier that delivers controlled voltage pulses to the nozzle 28 to activate droplet formation and expulsion.

The SALD station 14 operates to conformally coat the regions of the working surface 24 of the build substrate 26 not inhibited by the inhibition material pattern with an ultra-high aspect ratio sub-nanometer precision film of the ALD material one atomic layer at a time. The SALD station 14 includes a frame 42, a bridge 44, and a zoned ALD precursor gas distributor 46. The frame 42 includes first and second upstanding adjustable support legs 48a, 48b that are spaced apart from one another above the stand surface. The first and second upstanding support legs 48a, 48b support the bridge 44 horizontally in an elevated position. The bridge 44 comprises an elongated body 50 that carries the zone ALD precursor gas distributor 46. The elongated body 50 may be stationarily or tiltably supported on the upstanding support legs 48a, 48b. If tiltably supported, the elongated body 50 may be tiltable about each of its long and short axes and, as such, would have the potential to control the tilt of the ALD precursor gas distributor 16 in a corresponding manner as needed. In the embodiment shown here, the elongated body 50 is an elongated plate 52 that defines a central opening 54 through which the zoned ALD precursor gas distributor 46 is supported.

Figure 4:
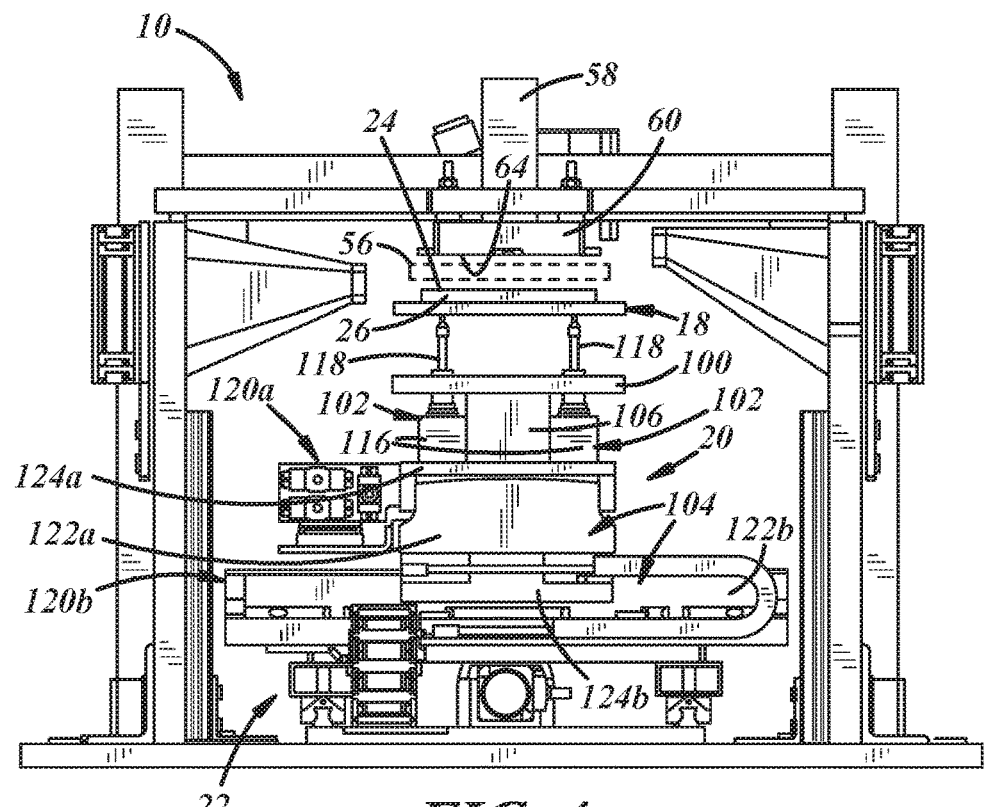
FIG. 4 is a view of the integrated E-jet printing and SALD system illustrated in FIG. 1 through the SALD station according to one embodiment of the present disclosure.
Figure 5:
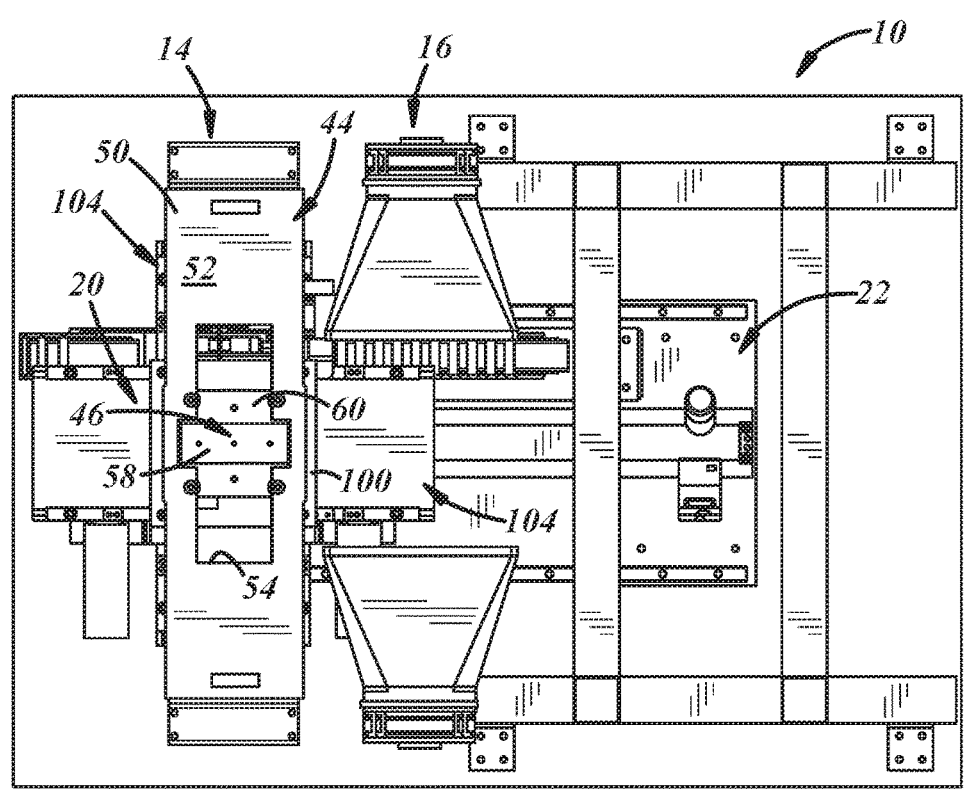
FIG. 5 is a plan view of a portion of the integrated E-jet printing and SALD system (with portions of the E-jet printing station omitted) illustrated in FIG. 1 according to one embodiment of the present disclosure.
Figure 8:
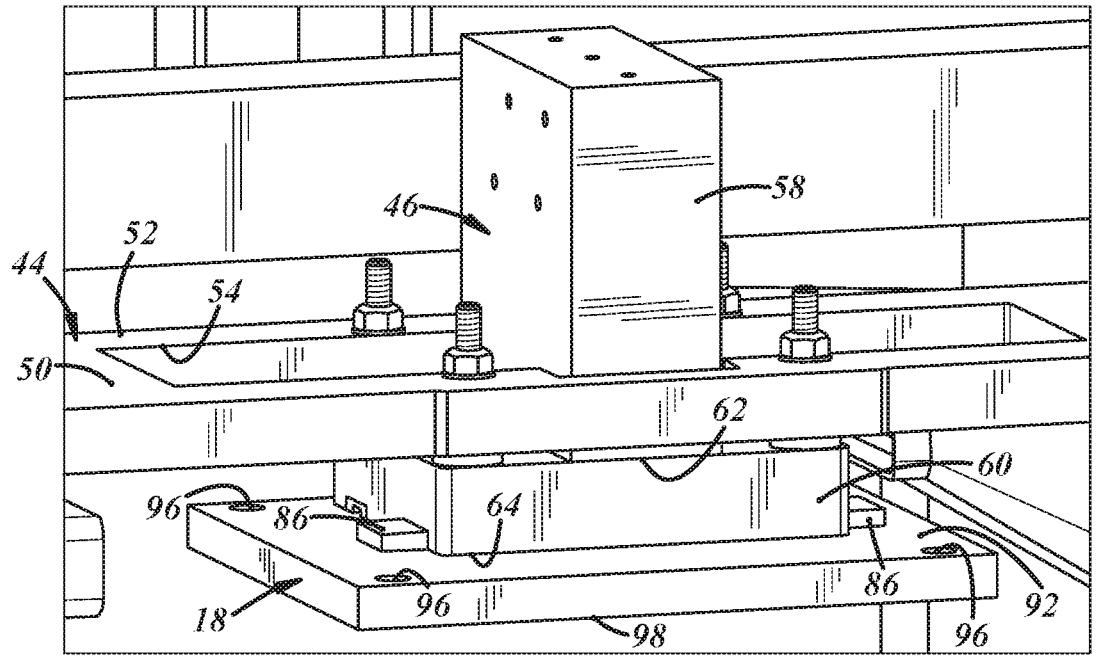
FIG. 8 is a magnified perspective view of a depositor head of a zoned ALD precursor gas distributor of the SALD station and an opposed substrate plate.
Figure 7:
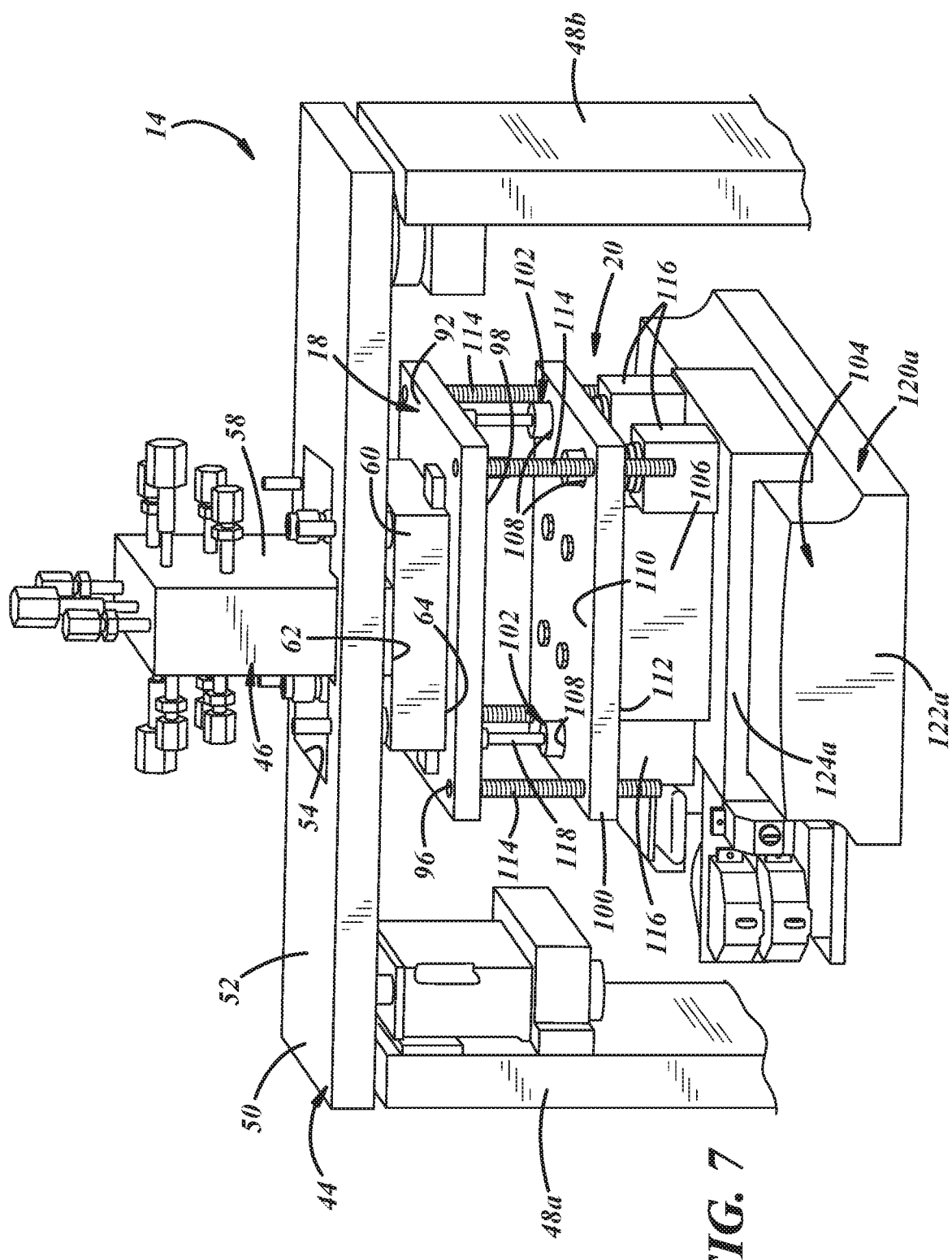
FIG. 7 is a perspective view of the SALD station of the E-jet printing and SALD system according to one embodiment of the present disclosure.

The zoned ALD precursor gas distributor 46, which is shown best in FIGS. 4 and 7-8, discharges linear zone-separated first and second ALD precursor gases towards the substrate plate 18 that retains the build substrate 26 within a deposition window 56 where SALD growth is directed. The first and second ALD precursor gases used during SALD processing may vary depending on the composition of the ALD material film being deposited. The first ALD precursor gas may, for example, be an organometallic gas, and the second ALD precursor gas may be an oxidant gas. In one implementation of SALD, the ALD material film grown on the build substrate may comprise a metal oxide such as zinc oxide (ZnO), tin oxide ($SnO_2$), or aluminum oxide ($Al_2O_3$). To deposit ZnO, $SnO_2$, or $Al_2O_3$ by SALD, the first ALD precursor gas (an organometallic gas) may be diethylzinc (DEZ) for ZnO, tetrakis(dimethylamido)tin (TDMASn) for $SnO_2$, and dimethylaluminum isopropoxide (DMAI) or trimethyl aluminum (TMA) for $Al_2O_3$, and the second ALD precursor gas (an oxidant gas) in each instance may be distilled water. The inert gas used to separate and isolate the first and second ALD precursor gases may be nitrogen ($N_2$). Of course, other ALD precursor gases and inert gases may be employed to form any of the aforementioned metal oxides films as well as other compositions of the ALD material. The SALD apparatus described herein and the ways in which the SALD apparatus is used are not limited to any particular ALD precursor gases, inert gases, or compositions of the deposited ALD material film.

The zoned ALD precursor gas distributor 46 includes a gas manifold 58 and a depositor head 60. The gas manifold 58 is fluidly connected above the elongated plate 52 to sources (not shown) of the first ALD precursor gas, the second ALD precursor gas, and the inert gas, and is also fluidly connected to a vacuum source to provide suction for the exhaust of unreacted precursor gases and the inert gas. The gas manifold 58 extends through the central opening 54 to a delivery end 62 of the manifold 58 disposed below the elongated plate 52. The depositor head 60 is secured to the delivery end 62 of the gas manifold 58 below the elongated plate 52 by fasteners or another type of joint, although in other implementations the gas manifold 58 and the depositor head 60 may be integrally formed. The depositor head 60 may be constructed from stainless steel or some other electrically-conductive and chemically-inert material that does not react adversely with the precursor gases during delivery. Mass flow controllers may be attached to the gas manifold 58 or they may be more remotely located to control the flow of the first and second ALD precursor gases as well as the flow of the inert gas.

Figure 9:
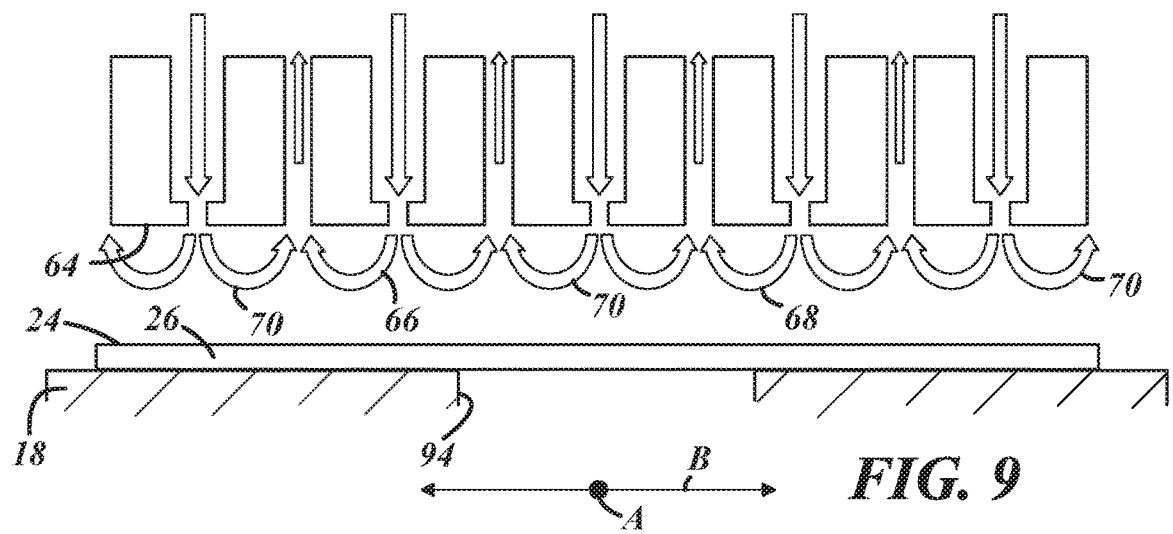
FIG. 9 is a schematic cross-sectional view of the depositor head of a zoned ALD precursor gas distributor of the SALD station, including a representation of the linear gas zones established by the depositor head, and an opposed build substrate carried on a substrate plate according to one embodiment of the present disclosure.

The depositor head 60 has an active surface 64 configured to discharge at least one linear flow of the first ALD precursor gas 66, at least one linear flow of the second ALD precursor gas 68, and at least one linear flow of the inert gas 70 that separates the linear flow of the first ALD precursor gas 66 and the linear flow of the second ALD precursor gas 68, as shown schematically in FIG. 9. The linear flow of the first ALD precursor gas 66, the linear flow of the second ALD precursor gas 68, and the linear flow of the inert gas 70 are parallel to each other and extend in a first direction A (into the page). Since the linear flows of the ALD precursor gases 66, 68 are separated and flow isolated by the linear flow of the inert gas 70, the linear flow of the first ALD precursor gas 66 and the linear flow of the second ALD precursor gas 68 establish first and second ALD precursor gas zones, respectively, while the linear flow of the inert gas 70 establishes an inert gas curtain. More than one linear flow of the first ALD precursor gas and more than one linear flow of the second ALD precursor gas may be delivered from the active surface 64 of the depositor head 60 so long as the linear flows of the first and second ALD precursor gases alternate across the active surface 64 with each pair of adjacent linear flows of the first and second ALD precursor gases being separated by a linear flow of the inert gas to ensure the establishment of respective ALD precursor gas zones.

Figure 10:
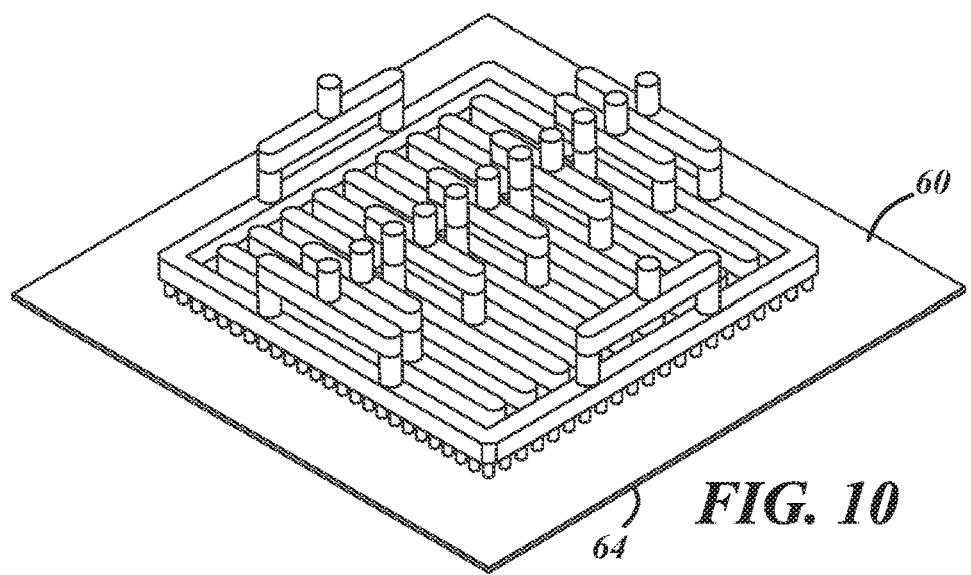
FIG. 10 is a perspective view of the depositor head of a zoned ALD precursor gas distributor of the SALD station according to one embodiment of the present disclosure.
Figure 11:
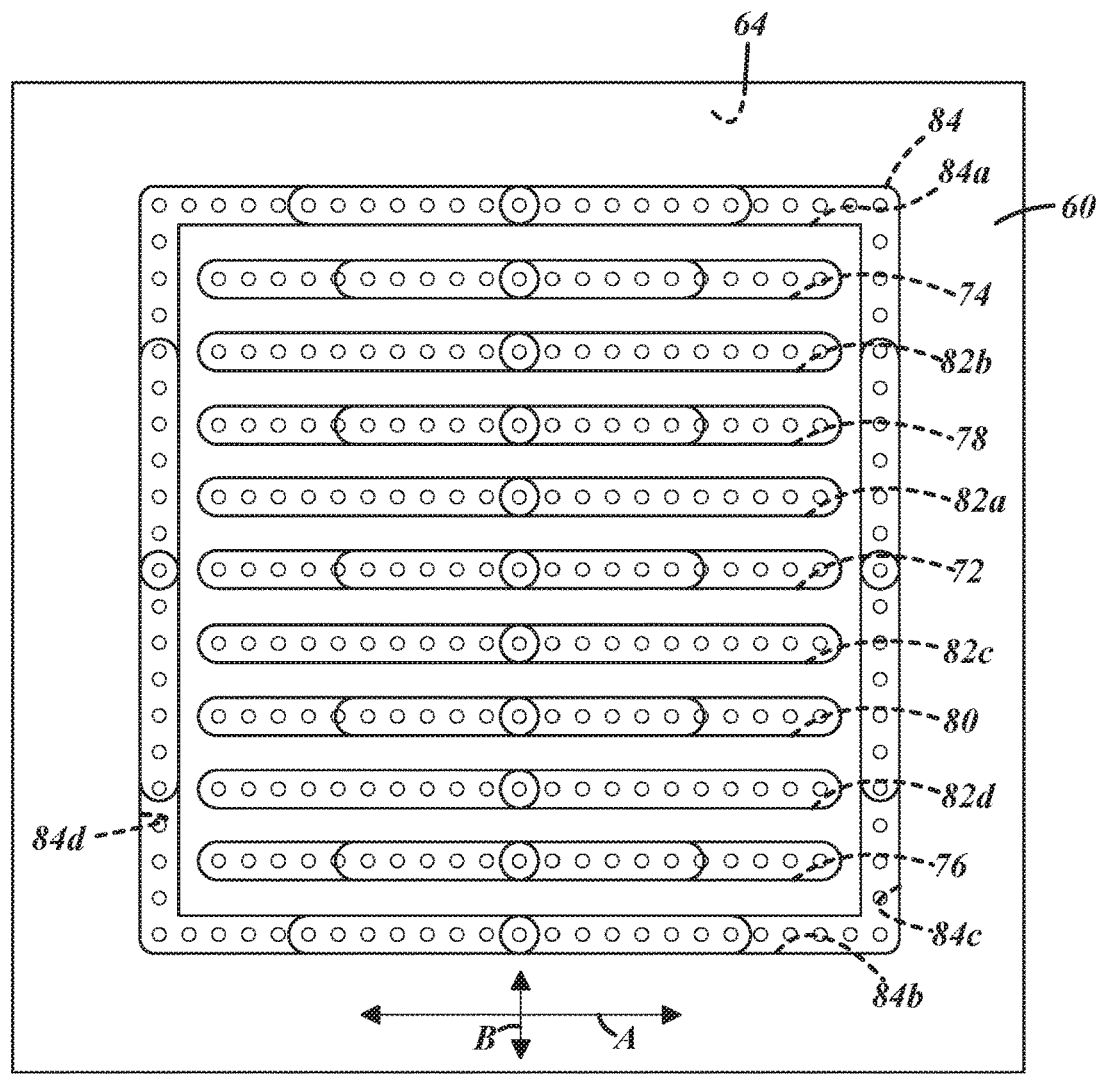
FIG. 11 is a plan view the depositor head of a zoned ALD precursor gas distributor of the SALD station in FIG. 10 according to one embodiment of the present disclosure.

In one specific embodiment, as shown in FIGS. 10-11 and often referred to as a "showerhead" delivery arrangement, the active surface 64 of the depositor head 60 may define a central elongated channel 72 that discharges a linear flow of the first ALD precursor gas. The active surface 64 also defines a second elongated channel 74 on one side of the central elongated channel 72 and a third elongated channel 76 on the other side of the central elongated channel 72. Each of the second and third elongated channels 74, 76 extends parallel to the central elongated channel 72 and discharges a linear flow of the second ALD precursor gas. And, to keep the linear flows of the first and second ALD precursor gases isolated into their respective ALD precursor gas zones, a fourth elongated channel 78 is defined by the active surface 64 between the central elongated channel 72 and the second elongated channel 74 that discharges a linear flow of the inert gas, and a fifth elongated channel 80 is defined by the active surface 64 between the central elongated channel 72 and the third elongated channel 76 that discharges a linear flow of the inert gas. Each of the fourth and fifth elongated channels 78, 80 extends parallel to each of the central, first, and second elongated channels 72, 74, 76 and is bound on each side by a pair of elongated vacuum ports 82a, 82b, 82c, 82d. The vacuum ports 82a, 82b, 82c, 82d communicate with exhaust lines to remove the inert gas any un-reacted ALD precursors gases. All of the elongated channels 72, 74, 76, 78, 80 all run parallel to each other and extend along the first direction A.

The active surface 64 of the depositor head 60 also defines a continuous peripheral border channel 84 that surrounds and encloses all of the other channels 72, 74, 76, 78, 80. The peripheral border channel 84 includes first and second elongated side channel portions 84a, 84b that run parallel to the other elongated channels 72, 74, 76, 78, 80 and, thus, extend in the first direction A. Additionally, the peripheral border channel 84 includes first and second elongated bridge channel portions 84c, 84d that run perpendicular to the elongated channels 72, 74, 76, 78, 80 and connect with the elongated side channel portions 84a, 84b to complete the continuous track of the peripheral border channel 84. The peripheral border channel 84 discharges a flow of the inert gas and, more specifically, the four channel portions 84a, 84b, 84c, 84d of the peripheral border channel 84 discharge corresponding linear flows of the inert gas. In that regard, a linear flow of the inert gas is located on each side of the second and third elongated channels 74, 76 opposite the fourth and fifth elongated channels 78, 80, respectively, such that an inert gas curtain is present on each side of the second ALD precursor gas zones established by the linear flows of the second ALD precursor gas discharged from the second and third elongated channels 74, 76.

Because of the zone-separated nature of linear flows of the ALD precursor gases, oscillating the build substrate 26 in a second direction B transverse to the first direction A alternately exposes the working surface 24 to the first and second ALD precursor gas zones. During each cycle of exposure to both the first and second ALD precursor gas zones, the two ALD precursor gases react to form an ALD material layer that constitutes all or part of the ALD material film. Indeed, the number of atomic layers of the ALD material that are deposited, and thus the corresponding thickness of the ALD material film grown on the working surface 24 of the build substrate 26, depends on the number of times the working surface 24 is exposed to both the first and second ALD precursor gases by transverse movement through the linear first and second ALD precursor gas zones. The oscillation of the build substrate 26 beneath the depositor head 60 of the zoned ALD precursor gas distributor 46 is effectuated by the motion actuator 20 as will be described in more detail below.

The SALD station 14 may include other components in addition to the frame 42, the bridge 44, and the zoned ALD precursor gas distributor 46. For example, a series of gap detection sensors 86 may be mounted to depositor head 60 to measure the distance between the active surface 64 of the depositor head 60 and the confronting surface of the substrate plate 18, as illustrated in FIG. 8. Each of the gap detection sensors 86 may be a capacitive sensor, a photo-electric sensor, an inductive sensor, or a laser sensor. The gap detection sensors 86 can measure the gap between the depositor head 60 and the substrate plate 18 in real time and can input measurement data into a controller that, in turn, can adjust the distance between the depositor head 60 and the substrate plate 18 by, for example, tilting the depositor head 60 via the elongated plate 52 and/or by tilting the substrate plate 18 that retains the build substrate 26. The SALD station 14 may also include gas lines, vacuum lines, and a chiller to store and cool the first and/or second ALD precursor gases in the event the gas or gases are too volatile at room temperature.

The cooling station 16 is located between the E-jet printing station 12 and the SALD station 14. The cooling station 16 includes at least one duct 88 that is in fluid communication with a fan 90 that forces a gas, preferably air, through the duct 88 at ambient temperature (i.e., 20° C.-25° C.) or below ambient temperature. The gas exiting the duct(s) 88 establishes a cooling gas zone $C_Z$. Upon exiting the SALD station 14, in which the heatable substrate plate 18 and the build substrate 26 are typically heated in order to carry out the SALD process, the build substrate 26 may pass through, either continuously or it may be held within the cooling gas zone $C_Z$ for a period of time, to reduce the temperature of the build substrate 26, particularly if the build substrate 26 is being delivered to the E-jet printing station 12 for patterned printing.

The heatable substrate plate 18 carries and supports the build substrate 26 in both the E-jet printing station 12 and the SALD station 14. In other words, the heatable substrate plate 18 is a common substrate plate used in both stations 12, 14, and to that end the heatable substrate plate 18 satisfies the operating conditions for each station 12, 14 while also being transportable therebetween. The heatable substrate plate 18 includes a support surface 92 that retains the build substrate 26. The support surface 92 defines one or more vacuum holes 94 (FIG. 9) that communicate with a vacuum source through a vacuum chuck to create suction. This suction retains and holds the build substrate 26 in a defined position on the substrate plate 18 as needed for inhibition material printing at the E-jet printing station 12 and conformal SALD thin-film growth at the SALD station 14. The heatable substrate plate 18 may include an electric heater, such as a flexible polyamide heater attached to an exterior of the plate 18, so that the plate 18 can be heated to temperatures of 100° to 400° C.—the temperature varies depending on the composition of the ALD precursor gases and the desired composition and properties of the ALD material film being grown—for SALD processing, although other heating mechanisms may certainly be employed. The heatable substrate plate 18 may be constructed from a nickel-iron alloy. One such alloy that is suitable here is FeNi36 or Invar. Additionally, as shown here, the substrate plate 18 may define a plurality of locator shaft openings 96 that traverse the plate 18 from the support surface 92 to a back surface 98 of the plate 18 opposite the support surface 92.

The motion actuator 20 supports the heatable substrate plate 18 and is controllable with standard controllers and programming logic to move the substrate plate 18, preferably in three dimensions. The motion actuator 20 includes a base plate 100, a plurality of linear actuators 102, and at least one linear motion stage 104, as shown best in FIGS. 4 and 6-7. The base plate 100 is positioned below the substrate plate 18 and is disposed on a central block 106 that is either integral with the base plate 100 or secured to the base plate 100 by, for example, one or more fasteners. The base plate 100 defines a plurality of openings 108 that traverse the base plate 100 from a top surface 110 of the plate 100 to a bottom surface 112 of the plate 100 opposite the top surface 110. The base plate 100 may also include a plurality of threadably-supported locator shafts 114 that are aligned with and receivable through the plurality of locator shaft openings 96 defined in the substrate plate 18. The locator shafts 114 may be used to achieve initial positioning of the substrate plate 18 relative to the base plate 100 or to maintain the position of the plates 18, 100 when the system 10 is off-line. The locator shafts 114, however, are generally not secured to the substrate plate 18 with nuts or other threaded engagement devices, although they may extend freely through the locator shaft openings 96, when the substrate plate 18 is engaged in printing or ALD material film growth at the E-jet printing stage 12 and the SALD stage 14, respectively.

The plurality of linear actuators 102 are operable to adjust the spacing between the substrate plate 18 and the base plate 100 and to also control the tilt of the substrate plate 18. Each of the plurality of linear actuators 102 includes a motor 116 and an actuation rod 118. The actuation rod 118 of each actuator 102 is displaceable in both a positive (forward or extending) and negative (rearward or retracting) direction by its respective motor 116 which, for example, is preferably a stepper motor. Each of the motors 116 used to drive linear displacement of its respective linear actuation rods 118 preferably has a step size or resolution of 1.5 µm or higher to enable precision guided linear displacement of the actuation rods 118. The linear actuators 102 can be controlled as needed to adjust the vertical position and/or the tilt of the substrate plate 18 if needed at the E-jet printing station 12 and/or the SALD station 14 to ensure proper alignment with the E-jet printing nozzle 28 and/or the depositor head 60, respectively. Commercially available actuator assemblies that include a motor and an actuator rod may be used including, for example, a linear motion stepper motor assembly from Haydon Kerk Pittman. While stepper motors and actuation rods are described here as being preferred implementations, it will be appreciated that other types of linear actuators and driving mechanisms may of course be employed to achieve the same functionality.

Each of the plurality of linear actuators 102 extend through one of the plurality of openings 108 defined in the base plate 100 and engages the back surface 98 of the support plate 18. As shown here, for example, the motor 116 of each actuator 102 may be secured to the central block 106 of the motion actuator 20 below the base plate 100, and the actuation rod 118 driven by each respective motor 116 may extend through the associated opening 108 of the base plate 100. Tip ends of the actuation rods 118, in turn, engage the back surface 98 of the support plate 18 at spaced engagement points and are actuatable individually or collectively to change the relative positioning of the substrate plate 18 relative to the base plate 100.

The at least one linear motion stage 104 supports the central block 106 and commands movement of the base plate 100, and by extension the substrate plate 18, within a horizontal plane along two coordinate axes. The movement of the substrate plate 18 in by the linear motion stage(s) 104 in the horizontal plane, together with the ability to command both tilting movement of the substrate plate 18 and vertical movement of the substrate plate 18 in dimension orthogonal to the horizontal plane with the plurality of linear actuators 102, enables the substrate plate 18 to be moved relative to the E-jet printing nozzle 28 and the depositor head 60 of the zoned ALD precursor gas distributor 46 when present at the E-jet printing station 12 and the SALD station 14, respectively. As shown best in FIGS. 4 and 6, the at least one linear motion stage 104 may be an upper single-axis linear motion stage 120a and a lower single-axis linear motion stage 120b. Each of the upper and lower single-axis linear motion stages 120a, 120b controls movement along one axis of the two-dimensional horizontal plane. Each stage 120a, 120b includes a travel stand 122a, 122b and a mobile table 124a, 124b that is slidable fore and aft along the travel stand 122a, 122b in a machine dimension. The sliding movement of the mobile table 124a, 124b is effectuated by a linear drive motor housed within the travel stand 122a, 122b. In general, each of the upper and lower single-axis linear motion stages 120a, 120b preferably has sub-micron resolution, or minimum incremental movement, typically on the order of 5 nm to 10 nm, and a maximum travel speed of 2 meters per second, along with sub-micron repeatability and sub-10-micron horizontal and vertical straightness. One specific and commercially available linear motion stage that satisfies these performance characteristics is an Aerotech Pro 165 LM mechanical bearing linear motor stage.

The upper and lower single-axis linear motion stages 120a, 120b are stacked and mounted orthogonal to each other. In particular, the central block 106 upon which the base plate 100 is disposed is mounted to the mobile table 124a of the upper single-axis linear motion stage 120a by mechanical fasteners, and the travel stand 122a of the upper single-axis linear motion stage 120a is mounted to the mobile table 124b of the lower single-axis linear motion stage 120b by mechanical fasteners. Sliding linear movement of the mobile tables 124a, 124b can therefore be coordinated to move the substrate plate 18 anywhere within the horizontal plane. In another embodiment, and rather than employing two single-axis linear motion stages, the at least one linear motion stage 104 may be a two-axis linear motion stage, such as the Aerotech PlanarDL two axis, mechanical bearing, direct drive linear stage. A two-axis linear motion stage of this type can move in both the X and Y directions with high accuracy, resolution, and bidirectional repeatability, and can support the central block 106 in the same manner as described above.

Figure 12:
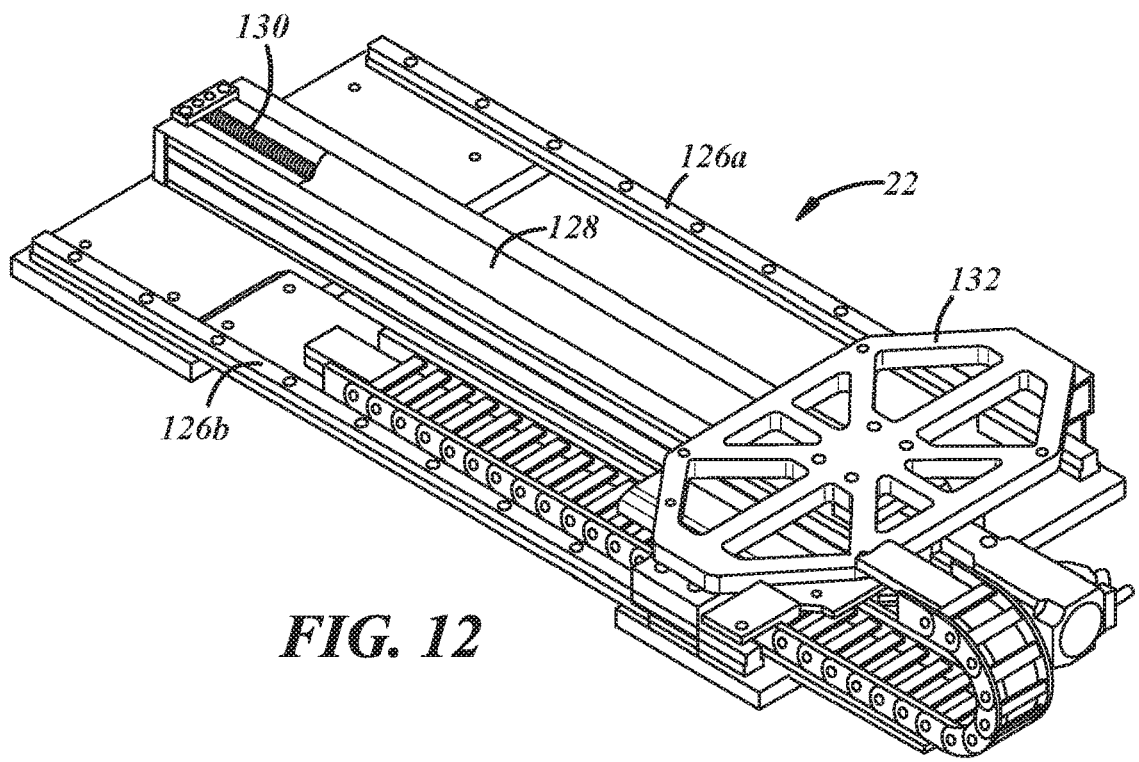
FIG. 12 is a perspective view of a conveyor operative to convey a motion actuator and a heatable support plate supported on the motion actuator between an E-jet station and a SALD station of the integrated E-jet printing and SALD system according to one embodiment of the present disclosure.

The motion actuator 20 is coupled to the conveyor 22, which extends and defines a linear travel path between the E-jet printing station 12 and the SALD station 14. The conveyor 22 may be a linear actuator of any suitable type. For example, and referring now to FIG. 12, the conveyor 22 may be a ball screw linear actuator that includes opposed linear guides 126a, 126b, a central guide track 128 that contains a rotatable threaded screw 130, and an adapter plate 132 onto which the motion actuator 20 is mounted. The adapter plate 132 is slidably received on the central guide track 128, while also being in threaded communication with the rotatable threaded screw 130 that extends within and along the central guide track 128. In that regard, the adapter plate 132 is drivable in one linear direction along the length and travel path of the conveyor 22 by rotation of the screw 130 in a first rotational direction and, likewise, is drivable in a second linear direction along the length and travel path of the conveyor 22, which is opposite the first linear direction, by rotation of the screw 130 in an opposite second rotational direction. The conveyor 22 may be any other type of linear actuator including a single axis linear motion stage similar to the ones described above in connection with the motion actuator 20 although a less accurate stage will likely suffice. By operation of the conveyor, the motion actuator 20 and, by extension, the common support plate 18, can be conveyed between the E-jet printing station 12 and the SALD station 14. This allows the substrate plate 18 and the build substrate 26 carried thereon to be conveyed between the printing window 36 of the E-jet printing nozzle 28 and the deposition window 56 of the depositor head 60 without having to remove the build substrate 26 from the substrate plate 18.

The integrated electrohydrodynamic jet printing and spatial atomic layer deposition system 10 may be used to conduct area-selective atomic layer deposition. The AS-ALD process may be performed via an additive printing or a subtractive printing approach at the E-jet printing station 12. Additive printing involves directly printing a pattern of the inhibition material onto the working surface 24 of the build substrate 26 to define a growth area in which no inhibition material is present and the ALD material film can be grown at the SALD station 14. Subtractive printing, on the other hand, involves directing a solvent at a deposition layer of an inhibition material to displace a portion of the inhibition material so as to expose and define a growth area of the working surface 24 in which no inhibition material is present and the ALD material film can be grown at the SALD station 14. Essentially, additive printing passivates the working surface 24 and subtractive printing activates the working surface 24 for ALD growth, but each nonetheless results in a deposited pattern of the inhibition material that defines a growth area. After the ALD material film is grown, at least some of the pattern of the inhibition material may be cured, thermally annealed, or partially removed. The curing, annealing, or removal of the inhibition material pattern may be integrated into the integrated electrohydrodynamic jet printing and spatial atomic layer deposition system 10 as an additional station along the travel path of the conveyor 22 between the E-printing station 12 and the SALD station 14 or it may be performed separate and apart from the system 10.

Referring now to FIGS. 1-13 and the top of FIG. 14, an AS-ALD process that employs subtractive printing is described. In that process, the heatable substrate plate 18 that supports the build substrate 26 is positioned within the printing window 36 of the E-jet printing nozzle 28 of the E-jet printing station 12. The build substrate 26 in this embodiment includes a pre-applied inhibition material deposition layer 134 such as a layer of PMMA. A pattern of a solvent, such as NMP, is then printed onto the inhibition material layer 134 of the build substrate 26 to selectively displace or remove a portion of the inhibition material layer to form a pattern 136 of the inhibition material. An ALD growth area 138 is thus defined on the working surface 24 by the inhibition material pattern 136 where the inhibition material coating has been displaced and, thus, is no longer present. Next, the heatable substrate plate 18 is conveyed away from the printing window 36 of the E-jet printing nozzle 28 and to the SALD station 14 by operation of the conveyor 22. The substrate plate 18 is positioned within the deposition window 56 of the zoned ALD precursor gas distributor 46 and heated as needed to support the reaction between the first and second ALD precursor gases. Once in position, an ALD material film 140 is deposited layer-by-layer on the growth area by oscillating the build substrate 26 relative to the depositor head 60 and transverse to the first and second ALD precursor gas zones. After the ALD material film 140 has been deposited, the pattern of the inhibition material 136 may be exposed to solvent vapors or plasma to remove some or all of the inhibition material pattern 136, if desired, and the substrate plate 18 may be conveyed away from the deposition window 56 of the zoned ALD precursor gas distributor 46 and brought to the cooling station 16 where the substrate plate 18 and the build substrate 26 are cooled. In other scenarios, rather than removing some or all of the inhibition material pattern 136, some or all of the inhibition material pattern 136 may be cured with ultraviolet light or be thermally annealed.

Referring still to FIGS. 1-13 and the bottom of FIG. 14, an AS-ALD process that employs additive printing is described. There, the heatable substrate plate 18 that supports a build substrate 26 is positioned within the printing window 36 of the E-jet printing nozzle 28 of the electrohydrodynamic jet printing station 12. An inhibition material solution, such PMMA or PVP in $H_2O$, DMSO, or anisole, is printed onto the working surface 24 of the build substrate 26 to apply the pattern of the inhibition material 136 onto the working surface 24. The pattern of the inhibition material 136 defines the ALD growth area 138 on the working surface 24 where the printed inhibition material pattern has not been applied and is not present. Next, the heatable substrate plate 18 is conveyed away from the printing window 36 of the E-jet printing nozzle 28 and to the SALD station 14 by operation of the conveyor 22. The substrate plate 18 is positioned within the deposition window 56 of the zoned ALD precursor gas distributor 46 and heated as needed to support the reaction between the first and second ALD precursor gases. Once in position, an ALD material film 140 is deposited layer-by-layer on the growth area by oscillating the build substrate 26 relative to the depositor head 60 and transverse to the first and second ALD precursor gas zones. After the ALD material film 140 has been deposited, the pattern of the inhibition material 136 may be exposed to solvent vapors or plasma to remove some or all of the inhibition material pattern 136, if desired, and the substrate plate 18 may be conveyed away from the deposition window 56 of the zoned ALD precursor gas distributor 46 and brought to the cooling station 16 where the substrate plate 18 and the build substrate 26 are cooled. In other scenarios, rather than removing some or all of the inhibition material pattern 136, some or all of the inhibition material pattern 136 may be cured with ultraviolet light or be thermally annealed.

It is to be understood that the foregoing description is of one or more preferred example embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items.

Other terms are to be construed using their broadest reasonable meaning unless they are used in a context that requires a different interpretation.

The invention claimed is:

1. An integrated electrohydrodynamic jet printing and spatial atomic layer deposition system for conducting nanofabrication, the system comprising:
   an electrohydrodynamic jet printing station that includes an E-jet printing nozzle;
   a spatial atomic layer deposition station that includes a zoned ALD precursor gas distributor that discharges linear zone-separated first and second ALD precursor gases;
   a heatable substrate plate supported on a motion actuator controllable to move the substrate plate in three dimensions; and
   a conveyor on which the motion actuator is supported, the conveyor being operative to move the motion actuator between the electrohydrodynamic jet printing station and the spatial atomic layer deposition station so that the substrate plate is conveyable between a printing window of the E-jet printing nozzle and a deposition window of the zoned ALD precursor gas distributor, respectively.

2. The integrated electrohydrodynamic jet printing and spatial atomic layer deposition system set forth in claim 1, further comprising:
   a cooling station located between the electrohydrodynamic jet printing station and the spatial atomic layer deposition station.

3. The integrated electrohydrodynamic jet printing and spatial atomic layer deposition system set forth in claim 1, wherein the motion actuator comprises at least one linear motion stage that supports the substrate plate.

4. The integrated electrohydrodynamic jet printing and spatial atomic layer deposition system set forth in claim 3, wherein the motion actuator further comprises a central block that is secured to the at least one linear motion stage and a base plate that is disposed on the central block, and wherein the motion actuator additionally comprises a plurality of linear actuators secured to the central block and which extend through corresponding openings in the base plate and engage and support the substrate plate above the base plate.

5. The integrated electrohydrodynamic jet printing and spatial atomic layer deposition system set forth in claim 4, wherein the plurality of linear actuators is controllable to adjust the tilt of the substrate plate relative to the base plate.

6. The integrated electrohydrodynamic jet printing and spatial atomic layer deposition system set forth in claim 1, wherein the conveyor defines a linear travel path for the motion actuator that extends between the electrohydrodynamic jet printing station and the spatial atomic layer deposition station.

7. The integrated electrohydrodynamic jet printing and spatial atomic layer deposition system set forth in claim 6, wherein the conveyor is a linear actuator.

8. The integrated electrohydrodynamic jet printing and spatial atomic layer deposition system set forth in claim 7, wherein the conveyor includes opposed linear guides, a central guide track that contains a rotatable threaded screw, and an adapter plate onto which the motion actuator is mounted.

9. The integrated electrohydrodynamic jet printing and spatial atomic layer deposition system set forth in claim 1, wherein the zoned ALD precursor gas distributor comprises a depositor head that has an active surface configured to discharge at least one linear flow of the first ALD precursor gas, at least one linear flow of the second ALD precursor gas, and at least one linear flow of the inert gas that separates the linear flow of the first ALD precursor gas and the linear flow of the second ALD precursor gas.

10. An integrated electrohydrodynamic jet printing and spatial atomic layer deposition system for conducting nanofabrication, the system comprising:
    an electrohydrodynamic jet printing station that includes an E-jet printing nozzle;
    a spatial atomic layer deposition station that includes a zoned ALD precursor gas distributor that discharges linear zone-separated first and second ALD precursor gases;
    a heatable substrate plate supported on a motion actuator that comprises at least one linear motion stage that supports the substrate plate and commands movement of the substrate plate within a horizontal plane along two coordinate axes;
    a build substrate retained on the heatable substrate plate, the build substrate having a working surface on which an inhibition material is applied at the electrohydrodynamic jet printing station and an ALD material film is grown at the spatial atomic layer deposition station; and
    a conveyor on which the motion actuator is supported, the conveyor being operative to move the motion actuator along a linear travel path between the electrohydrodynamic jet printing station and the spatial atomic layer deposition station.

11. The integrated electrohydrodynamic jet printing and spatial atomic layer deposition system set forth in claim 10, further comprising:
    a cooling station located between the electrohydrodynamic jet printing station and the spatial atomic layer deposition station.

12. The integrated electrohydrodynamic jet printing and spatial atomic layer deposition system set forth in claim 10, further comprising an atomic force microscope.

13. A method of conducting area-selective atomic layer deposition, the method comprising:
    positioning a heatable substrate plate that supports a build substrate within a printing window of an E-jet printing nozzle of an electrohydrodynamic jet printing station;
    forming a pattern of an inhibition material onto a working surface of the build substrate to define an ALD growth area on the working surface using the E-jet printing nozzle;
    conveying the heatable substrate plate away from the printing window of the E-jet printing nozzle of the electrohydrodynamic jet printing station and to a spatial atomic layer deposition station without removing the build substrate from the substrate plate;
    positioning the heatable substrate plate that supports the build substrate within a deposition window of a zoned ALD precursor gas distributor discharges linear zone-separated first and second ALD precursor gases towards the substrate plate; and
    depositing an ALD material film onto the ALD growth area.

14. The method set forth in claim 13, further comprising:
    conveying the heatable substrate plate along the conveyor away from the deposition window of the zoned ALD precursor gas distributor and to a cooling station located between the electrohydrodynamic jet printing station and the spatial atomic layer deposition station; and
    cooling the heatable substrate plate.

15. The method set forth in claim 13, wherein forming a pattern of an inhibition material comprises:
   providing a deposited layer of an inhibition material over the working surface of the build substrate; and
   printing a solvent onto the layer of the inhibition material to selectively remove a portion of the layer of the inhibition material to form the pattern of the inhibition material.

16. The method set forth in claim 13, wherein forming a pattern of an inhibition material comprises:
   printing an inhibition material solution onto the working surface of the build substrate to apply the pattern of the inhibition material onto the working surface.

17. The method set forth in claim 13, further comprising:
   removing some or all of the pattern of the inhibition material after the ALD material film has been deposited onto the ALD growth area.

18. The method set forth in claim 13, further comprising:
   curing some or all of the pattern of the inhibition material after the ALD material film has been deposited onto the ALD growth area.

19. The method set forth in claim 13, further comprising:
   thermally annealing some or all of the pattern of the inhibition material after the ALD material film has been deposited onto the ALD growth area.

* * * * *